United States Patent
Malametz et al.

(10) Patent No.: US 6,912,902 B2
(45) Date of Patent: Jul. 5, 2005

(54) BENDING BEAM ACCELEROMETER WITH DIFFERENTIAL CAPACITIVE PICKOFF

(75) Inventors: David L. Malametz, Lynnwood, WA (US); Stephen F. Becka, North Bend, WA (US); Robert D. Horning, Savage, MN (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 10/400,591

(22) Filed: Mar. 26, 2003

(65) Prior Publication Data

US 2004/0187578 A1 Sep. 30, 2004

(51) Int. Cl.⁷ .............................................. G01P 15/125
(52) U.S. Cl. ................................ 73/514.32; 73/514.36
(58) Field of Search ......................... 73/514.02, 514.14, 73/514.24, 514.29, 514.32, 514.36, 514.37, 514.38

(56) References Cited

U.S. PATENT DOCUMENTS

| | | | | |
|---|---|---|---|---|
| 4,736,629 A | * | 4/1988 | Cole ........................ | 73/514.32 |
| 5,126,812 A | * | 6/1992 | Greiff ....................... | 257/417 |
| 5,203,208 A | * | 4/1993 | Bernstein ................. | 73/504.12 |
| 5,446,616 A | * | 8/1995 | Warren ..................... | 361/283.2 |
| 5,561,248 A | * | 10/1996 | Negoro ..................... | 73/514.32 |
| 5,635,739 A | * | 6/1997 | Greiff et al. .............. | 257/254 |
| 5,905,203 A | * | 5/1999 | Flach et al. .............. | 73/514.32 |
| 5,969,250 A | * | 10/1999 | Greiff ....................... | 73/514.38 |
| 6,029,517 A | * | 5/2000 | Brun et al. ............... | 73/514.38 |
| 6,230,567 B1 | * | 5/2001 | Greiff ....................... | 73/514.37 |
| 2003/0019295 A1 | | 1/2003 | Devadas et al. | |
| 2003/0036214 A1 | | 2/2003 | Eskridge | |

FOREIGN PATENT DOCUMENTS

| | | |
|---|---|---|
| EP | 0362090 | 4/1990 |
| JP | 2003 043078 | 2/2003 |

OTHER PUBLICATIONS

Genberg S et al., Acceleration Sensors for Solid State Electronic Safety and Arming Devices, International Journal for Hybrid Microelectronics, Int. Society for Hybrid Microelectronics, Silver Spring, MD, vol. 12, No. 3, (Sep. 1, 1989).

* cited by examiner

Primary Examiner—Hezron Williams
Assistant Examiner—John Hanley
(74) Attorney, Agent, or Firm—Honeywell Int'l Inc.

(57) ABSTRACT

A low cost, pendulous, capacitive-sensing Micro Electro-Mechanical Systems (MEMS) accelerometer is provided. The accelerometer includes a pendulous proof mass, one or more securing pads, and one or more flexures coupled with the pendulous proof mass and the one or more securing pads. The flexures flex linearly with respect to motion of the pendulous proof mass. First and second capacitor plates are positioned relative to the pendulous proof mass for detecting motion of the proof mass according to a sensed difference in capacitance. One or more strain isolation beams are connected between the one or more flexures and the pendulous proof mass or the securing pads. The strain isolation beams protect the flexures from mechanical strain.

6 Claims, 3 Drawing Sheets

BENDING BEAM ACCELEROMETER WITH DIFFERENTIAL CAPACITIVE PICKOFF

BACKGROUND OF THE INVENTION

Micro Electro-Mechanical Systems (MEMS) accelerometers typically consist of a pendulous proof mass, a suspension system (flexures) and a method for determining the relative motion of the proof mass under the influence of acceleration (F=MA). Surviving high shock environments while maintaining performance necessary for navigation purposes imposes significant obstacles on Micro Electro-Mechanical Systems (MEMS) accelerometers. Very small MEMS accelerometers are required in order to survive high shock environments. Flexure systems for MEMS accelerometers must be designed to limit motion to a unique sensing axis. The flexure suspension must minimize the effects from environmental stress and strain while possessing enough strength to permit operation in high shock environments. Historically, strain isolation is required on these types of devices to isolate the sensor from mounting strains. The strains experienced are typically due to the thermal coefficient of expansion (TCE) difference between the device material and the mounting material.

Single axis, pendulous, capacitive-sensing MEMS accelerometers are extremely popular for high shock environments at a low cost. Their small overall geometry is ideal for high shock packages that require minimum size. FIG. 1 illustrates torsional flexures that are used to support a pendulous mass for one of these accelerometers. Thus, unwanted twisting occurs. Also, the torsional flexures sag from the weight of the pendulous mass, thereby introducing an error source.

Therefore, there is an unmet need for a pendulous MEMS accelerometer with improved pendulous support and greater isolation from mechanical strains.

SUMMARY OF THE INVENTION

The present invention provides low cost, pendulous, capacitive-sensing Micro Electro-Mechanical Systems (MEMS) accelerometers for high shock environments. The present invention reduces non-linearity flexure effects, thereby leading to a more accurate acceleration sensing.

The accelerometer of the present invention includes a pendulous proof mass, one or more securing pads, and one or more flexures coupled with the pendulous proof mass and the one or more securing pads. The flexures flex linearly with respect to motion of the pendulous proof mass. First and second capacitor plates are positioned relative to the pendulous proof mass for detecting motion of the proof mass according to a sensed difference in capacitance.

In one aspect of the invention, one or more strain isolation beams are connected between the one or more flexures and the pendulous proof mass or the securing pads. The strain isolation beams protect the flexures from mechanical strain.

BRIEF DESCRIPTION OF THE DRAWINGS

The preferred and alternative embodiments of the present invention are described in detail below with reference to the following drawings.

DETAILED DESCRIPTION OF THE INVENTION

Figure 1:
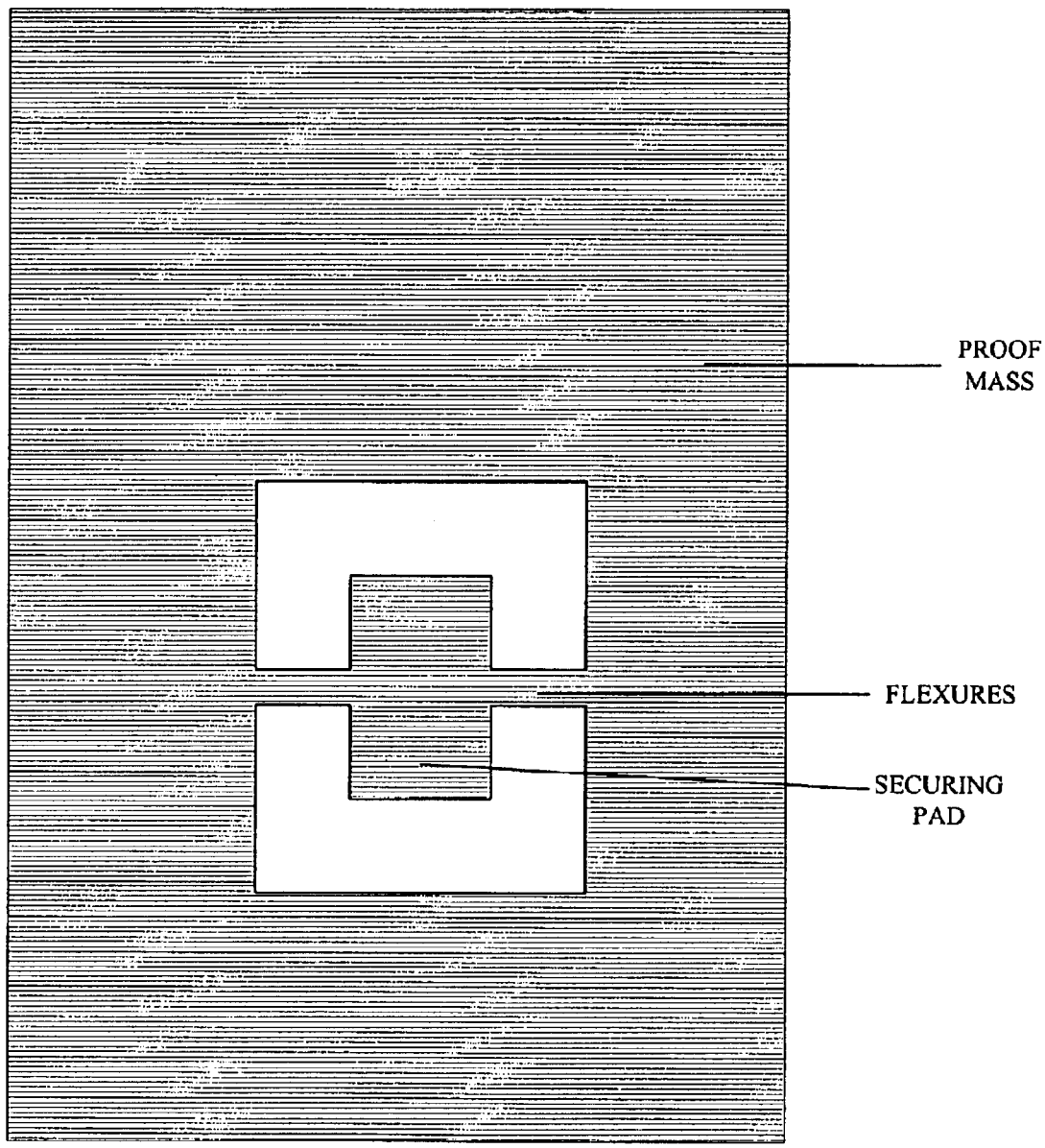
FIG. 1 illustrates a prior art torsional flexure for a pendulous Micro Electro-Mechanical Systems (MEMS) accelerometer.
Figure 2:
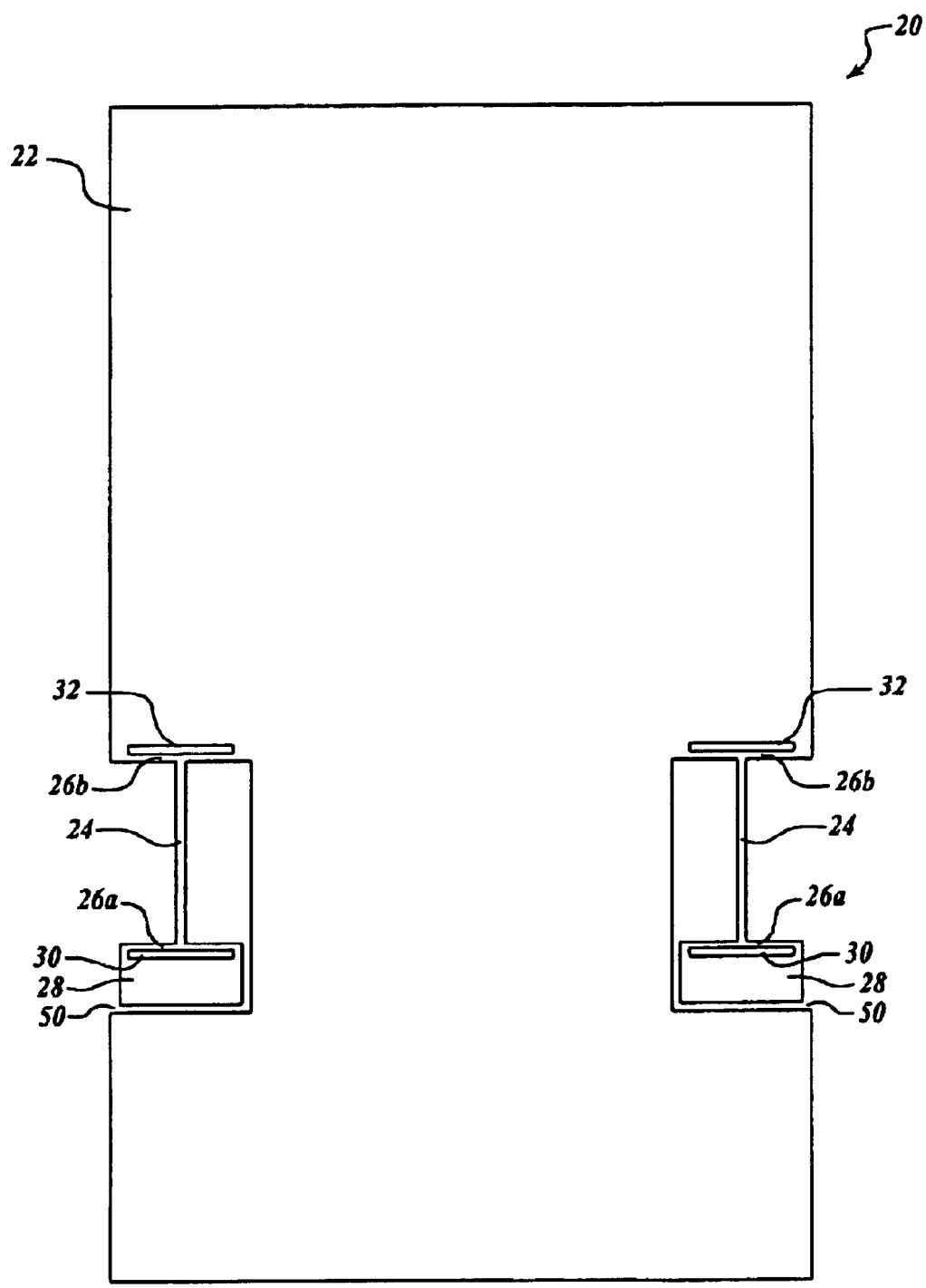
FIG. 2 is a top view of a pendulous MEMS accelerometer formed in accordance with the present invention.

FIG. 2 illustrates a single axis, pendulous, capacitive-sensing Micro Electro-Mechanical Systems (MEMS) accelerometer 20 formed in accordance with the present invention. The accelerometer 20 includes a pendulous proof mass 22, a pair of cantilever-style flexure beams 24, strain isolation beams 26a and 26b, and securing pads 28. The flexure beams 24 are approximately orthogonally connected at each end to strain isolation beams 26a and 26b. One of the strain isolation beams 26a that is coupled with the flexure beams 24 is attached at its ends to a respective securing pad 28, thereby creating a slot 30 between the beam 26a and the securing pads 28. The securing pads 28 are connected to a housing (not shown) that houses the accelerometer 20. The beam 26b that is connected to the other end of the flexure beam 24 is connected to the pendulous proof mass 22 at each end of the beam 26b, thereby creating a slot 32 between the second beam 26b and the pendulous proof mass 22. Through flexure of the strain isolation beams 26a and 26b, the flexure beams 24 can survive mechanical forces, such as shock and acceleration forces that are substantially parallel with a longitudinal axis of the proof mass 22, without causing damage to the flexure beams 24. In other words, the slots limit travel of the pendulous proof mass 22 to less than the failure strain of the components of the accelerometer 20.

In one embodiment, the beams 24, 26a, and 26b are made of the same material as the proof mass 22 and has the same thickness as the proof mass 22. Thus, construction of the accelerometer 20 is greatly simplified.

Figure 3:
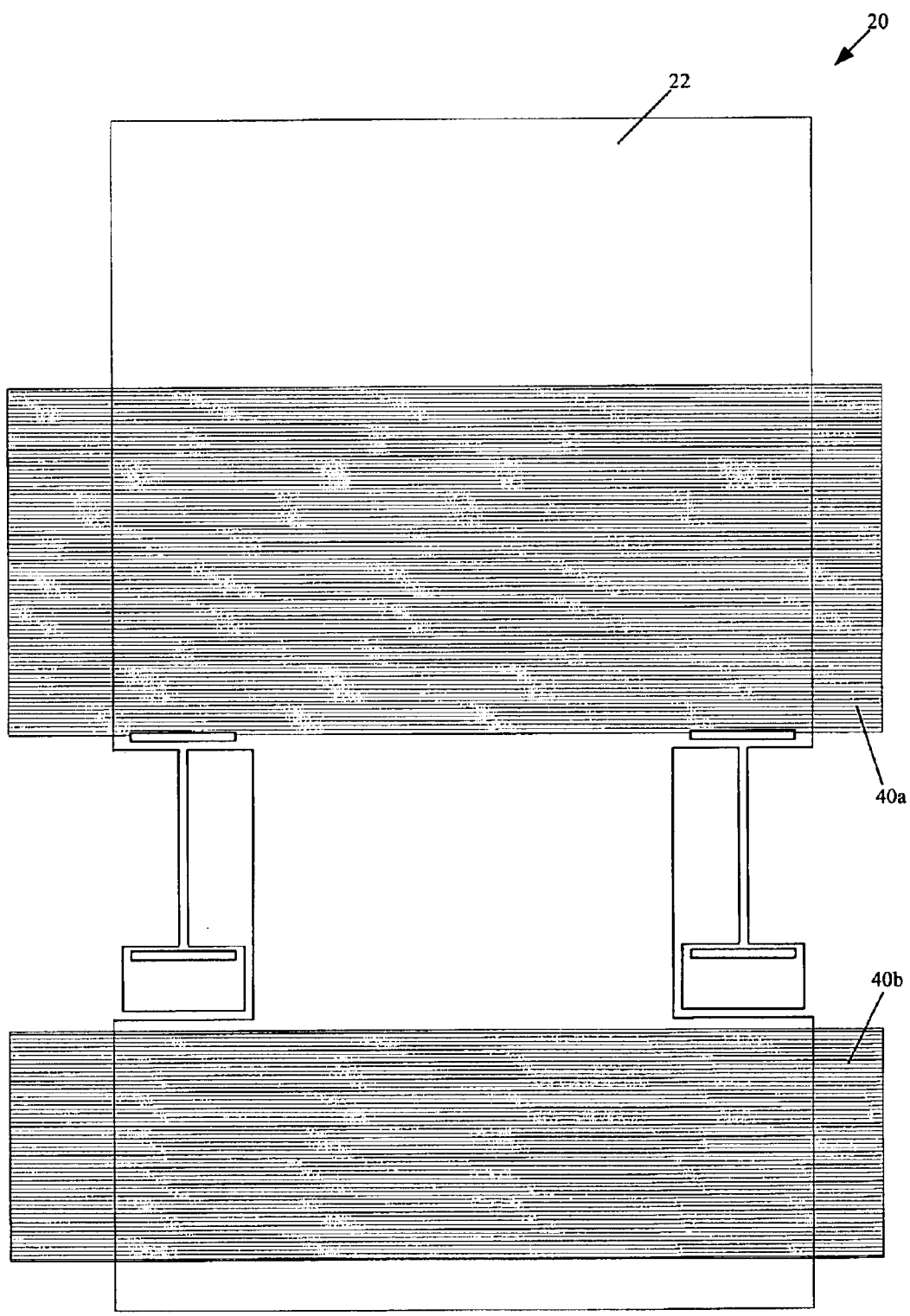
FIG. 3 is an x-ray view of the accelerometer in FIG. 2.

FIG. 3 illustrates an x-ray view of the accelerometer 20. The flexure beams 24 are suitably connected to the proof mass 22 in order to create a pendulous proof mass 22 with first and second sections. In other words, the proof mass 22 seesaws about the flexure beams 24, which have a linear relationship with the direction of proof mass deflection. The first section has more mass than the second section. Capacitor plates 40a and 40b are located on the support structure behind the first and second sections. The center of gravity of the proof mass 22 is suitably located off-center from the rotational axis of the proof mass 22 caused by the location of the cantilever-style bending beam flexures beams 24. The flexure beams 24 are of sufficient strength to suspend the proof mass 22 above respective capacitor plates 40a and 40b. When acceleration occurs, the proof mass 22 deflects under the externally applied g-load. The first capacitor plate 40a senses capacitance of the first section of the pendulous proof mass 22. The second capacitor plate 40b senses capacitance of the second section of the pendulous proof mass 22. By measuring the difference in capacitance between the two capacitor plates 40a and 40b, the applied acceleration is known within a high degree of accuracy.

In one embodiment of the present invention, above a predefined operational g-range the proof mass 22 deflects and contacts shock stops (not shown) that are located on the support structure.

Also, the securing pads 28 are separated from the proof mass 22 by caging slots 50 for limiting travel of the pendulous proof mass 22 to less than the failure strain of the components of the accelerometer 20. Thus, the caging slots 50 between the securing pads 28 and the proof mass 22 and the slots between the strain isolation beams 26a and b and the proof mass 22 cage the accelerometer 20 from high shock motion in any direction.

It can be appreciated, that although the examples of the present invention show that the flexure beams are approximately orthogonal to the sensitive axis, the flexure beams could be placed anywhere between parallel to perpendicular to the plane of the proof mass.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A micro electro-mechanical systems accelerometer, the accelerometer comprising:

a pendulous proof mass;

first and second securing pads;

first and second flexure beams, the first flexure beam being coupled with the first securing pad and the second flexure beam being coupled with the second securing pad, wherein the flexure beams have approximately the same thickness as the proof mass and have a longitudinal axis that is oriented approximately orthogonal to an axis of rotation of the proof mass; and first and second first strain isolation beams, the first strain isolation beam being connected between the first flexure beam and the pendulous proof mass and the second strain isolation beam being connected between the second flexure beam and the pendulous proof mass.

2. The accelerometer of claim 1, further comprising first and second capacitor plates, wherein the first capacitor plate is positioned relative to a first section of the pendulous proof mass, and the second capacitor plate is positioned relative to a second section of the pendulous proof mass.

3. The accelerometer of claim 1, wherein the securing pads are separated from the proof mass by a distance based on a failure strain value of the accelerometer.

4. The accelerometer of claim 1, wherein each of the securing pads includes a isolation beam connected to the respective flexure beam.

5. The accelerometer of claim 4, wherein the securing pads are separated from the proof mass by a slot for limiting travel of the pendulous proof mass to less than failure strain of the accelerometer.

6. A micro electro-mechanical systems accelerometer, the accelerometer comprising:

a pendulous proof mass;

first and second securing pads;

first and second flexure beams, wherein the flexure beams have approximately the same thickness as the proof mass and have a longitudinal axis that is oriented approximately orthogonal to an axis of rotation of the proof mass;

first, second, third, and fourth strain isolation beams, the first strain isolation beam being connected between the first flexure beam and the pendulous proof mass, the second strain isolation beam being connected between the second flexure beam and the pendulous proof mass, the third strain isolation beam being connected between the first flexure beam and the first securing pad, and the fourth strain isolation beam being connected between the second flexure beam and the second securing pad; and first and second slots located between the first and second securing pads and the proof mass, respectively, wherein the strain isolation beams protect the flexures from mechanical shock, and the slots limits travel of the pendulous proof mass to less than failure strain of the accelerometer.

\* \* \* \* \*